United States Patent [19]

Nagai et al.

[11] Patent Number: 5,902,395
[45] Date of Patent: May 11, 1999

[54] METHOD FOR FEEDING GRANULAR SILICON MATERIAL, FEED PIPE USED IN THE METHOD, AND METHOD OF MANUFACTURING A SILICON MONOCRYSTAL

[75] Inventors: Naoki Nagai; Isamu Harada; Chihiro Tashiro; Michiaki Oda, all of Annaka, Japan

[73] Assignee: Shin-Etsu Handotai Co., Ltd., Tokyo, Japan

[21] Appl. No.: 08/794,542

[22] Filed: Feb. 3, 1997

[30] Foreign Application Priority Data

Feb. 8, 1996 [JP] Japan .................................... 8-046701
Mar. 18, 1996 [JP] Japan .................................... 8-088828

[51] Int. Cl.$^6$ .................................................. C30B 15/02
[52] U.S. Cl. ................................................. 117/18; 117/33
[58] Field of Search ............................ 117/18, 33, 200, 117/201, 202, 19

[56] References Cited

U.S. PATENT DOCUMENTS

| | | | |
|---|---|---|---|
| 4,968,380 | 11/1990 | Freedman et al. | 117/25 |
| 5,242,667 | 9/1993 | Koziol et al. . | |
| 5,419,462 | 5/1995 | Johnston et al. . | |
| 5,587,016 | 12/1996 | Altekrüger et al. | 117/214 |
| 5,690,733 | 11/1997 | Nagai et al. | 117/18 |
| 5,733,368 | 3/1998 | Nagai et al. | 117/18 |

FOREIGN PATENT DOCUMENTS

| | | |
|---|---|---|
| 0315156 | 5/1989 | European Pat. Off. . |
| 0712945 | 5/1996 | European Pat. Off. . |
| 62-260791 | 11/1987 | Japan . |
| 6-286246 | 10/1994 | Japan . |

OTHER PUBLICATIONS

Fumio Shimura, "Semiconductor Silicon Crystal Technology", pp. 178–181, 1989.

Primary Examiner—Felisa Hiteshew
Attorney, Agent, or Firm—Oliff & Berridge, PLC

[57] ABSTRACT

In a pulling apparatus operated according to the multi-pulling method or CCZ method, granular silicon material is first fed to a feed pipe from a feeder so as to form stagnation of the granular silicon material in the feed pipe. The feeding of the granular silicon material from the feeder to the feed pipe is repeatedly commenced and stopped so as to maintain the stagnation of the granular silicon material. The feed rate of the granular silicon material from the feeder to the feed pipe is increased with time until the feed of the silicon material is completed. This prevents abrasion of a coating or lining provided on the inner surface of the feeder and also prevents damage of the feeder. In a pulling apparatus operated according to the Czochralski method, after causing granular silicon material to stagnate in the feed pipe, the crucible is lowered or the feed pipe is raised, while the stagnation of the granular silicon material is maintained, so as to form an unmolten layer of the granular silicon material on the molten or solidified surface of the silicon melt. The unmolten layer is then melted, and the granular silicon material is fed onto the unmolten layer through the feed pipe while the stagnation of the granular silicon material in the feed pipe is maintained. Accordingly, silicon material can be recharged without damaging the crucible, so that productivity and manufacturing yield of silicon monocrystals can be improved.

21 Claims, 6 Drawing Sheets

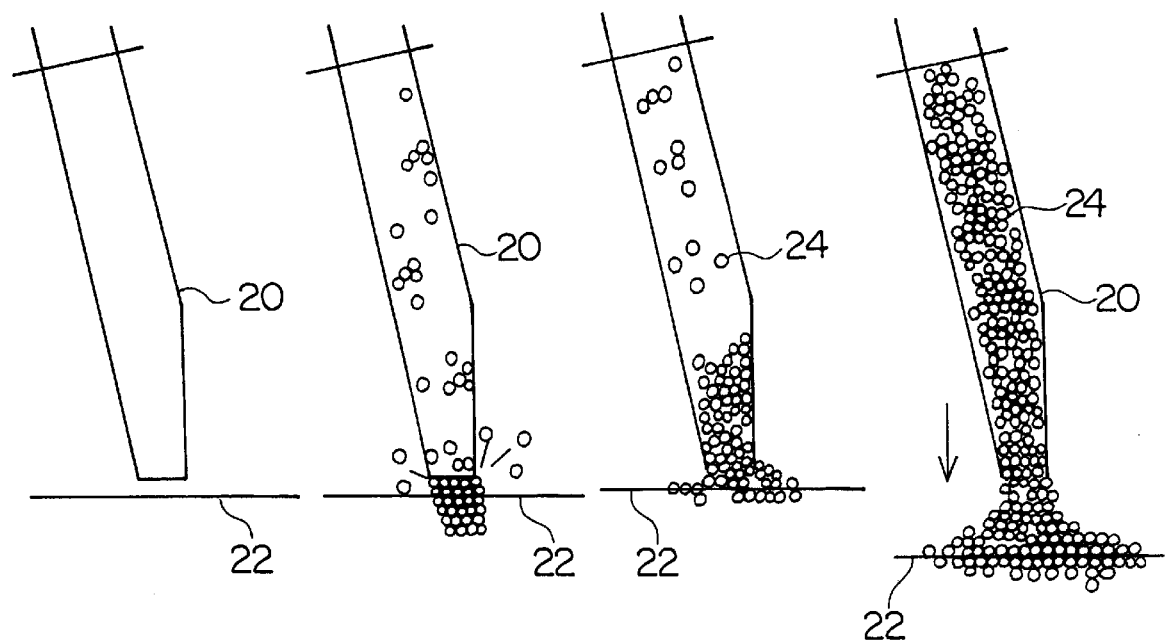

FORMING OF SOLIDIFIED SURFACE | CONTACT OF FEED PIPE | FORMING OF STAGNATION | HIGH-SPEED FEEDING | FORMING OF UNMOLTEN LAYER

FORMING OF UNMOLTEN LAYER | MELTING AND FEEDING

METHOD FOR FEEDING GRANULAR SILICON MATERIAL, FEED PIPE USED IN THE METHOD, AND METHOD OF MANUFACTURING A SILICON MONOCRYSTAL

BACKGROUND OF THE INVENTION

1. Field of the Invention

The present invention relates to a method of feeding silicon material at the time of manufacture of a silicon monocrystal using the Czochralski method as well as to a feed pipe used in the method. Further, the present invention relates to a method of manufacturing a silicon monocrystal using the Czochralski method.

2. Description of the Related Art

A multi-pulling method has been known as a method of reducing costs associated with manufacture of a silicon monocrystal using the Czochralski method (see "SEMICONDUCTOR SILICON CRYSTAL TECHNOLOGY," Fumio SHIMURA, pp. 178–179, 1989).

According to the multi-pulling method, after a silicon-monocrystal having a dopant concentration within a predetermined range has been pulled, silicon material is recharged into a crucible in a volume corresponding to the reduction in volume of the silicon material in the crucible. After the thus-recharged silicon material has been melt, the pulling of a silicon monocrystal is repeated. This method leads to an improved manufacturing yield. Further, the above-described method makes it possible to produce a plurality of silicon monocrystals from a quartz crucible capable of being usually used only once according to the common Czochralski method. Consequently, the cost of the crucible is decreased, thereby resulting in a decrease in manufacturing costs of the silicon monocrystal.

In addition to the multi-pulling method, there is a continuous Czochralski method (a CCZ method). According to this method, during the course of manufacture of a silicon monocrystal, a silicon monocrystal is pulled while silicon material is supplied to the silicon melt within the crucible which has been reduced in volume as a result of pulling of the silicon monocrystal. This method makes it possible to pull a silicon monocrystal while the quantity of silicon melt is maintained. Therefore, the concentration of oxygen in a silicon monocrystal and the resistivity of the silicon monocrystal, both of which depend on the quantity of silicon melt, can be made constant. Further, the method permits pulling of a long silicon monocrystal, which in turn makes it possible to considerably improve a manufacturing yield of the silicon monocrystal and to reduce manufacturing costs of the silicon monocrystal.

The previously-described multi-pulling method and CCZ method require recharge of silicon material to the crucible containing silicon melt after a silicon monocrystal has been pulled or while the silicon monocrystal is being pulled.

As silicon material recharging methods, there are a method of recharging granular silicon material and a method of recharging silicon material in the form of a rod or block, as shown in FIG. 1. In the method shown in FIG. 1, a large amount of silicon material 55 in the form of a rod or block is recharged into a crucible 51 containing residual silicon melt 52 at one time after a silicon monocrystal 53 has been pulled from the silicon melt 52.

The weight of silicon material to be recharged is approximately 80 kg in case of pulling a 200 mm diameter crystal and approximately 200 kg in case of pulling a 300 mm diameter crystal, and as the period of time required to recharge such a silicon material is shorter, the time required to manufacture a silicon monocrystal can be reduced, whereby the productivity of a silicon monocrystal can be improved. For this reason, a larger recharge rate of silicon material is desirable. If silicon material is recharged to the silicon melt while it is in the form of a rod or block, the recharge rate will become larger. However, intensive heating becomes necessary to melt a large quantity of silicon material recharged in a short period of time. A quartz crucible is apt to become damaged by the intensive heating. Consequently, dislocations may generate easily during the course of growth of a monocrystal. In the case where granular silicon materials are recharged to a silicon melt, the recharge rate can be increased; however, intensive heating becomes necessary, thereby causing the same problems as previously described.

Another method as shown in FIG. 2 is also known (see Japanese Patent Application Laid-Open (kokai) No. 62-260791). In the method shown in FIG. 2, the surface of silicon melt 62 remaining in a crucible 61 after a silicon monocrystal has been pulled is solidified, and silicon material 64 is deposited on the thus-solidified surface 63 of the silicon melt 62 through a feed pipe 60.

According to this method, silicon material is melted after having been deposited on the solidified surface of silicon melt. Therefore, in the case where a particularly large amount of silicon material is recharged, or the case where silicon material is supplied in such a highly-dense granular form, intensive heating becomes necessary to melt the silicon material. As a result, as in the previously described conventional method, the quartz crucible becomes apt to be damaged, thereby resulting in dislocations being apt to occur during the course of growth of a monocrystal.

The inventors of the present invention have previously proposed a method of feeding granular silicon material to silicon melt (Japanese Patent Application Laid-Open (kokai) No. 6-286246). In this method, granular silicon material is fed to silicon melt through a feed pipe from a feeder. Granular silicon material is first caused to stagnate in the feed pipe. At this time, the granular silicon material discharged from the tip end of the feed pipe is deposited on the silicon melt. Subsequently, the tip end of the feed pipe is brought into contact with the thus-deposited granular silicon material, whereby the granular silicon is fed to the silicon melt while the stagnation of the granular silicon material in the feed pipe is maintained.

According to this method, a high speed at which the granular silicon material falls on the silicon melt from the feeder through the feed pipe can be changed to a slow speed at which the granular silicon material stagnated in the feed pipe is discharged to the silicon melt from the tip end of the feed pipe, without changing a feed rate of the granular silicon material to the silicon melt. Consequently, scattering of the granular silicon material and splashing of the silicon melt can be prevented.

In this method, it is important to maintain the granular silicon material stagnated in the feed pipe. It is possible to maintain the granular silicon material stagnated in the feed pipe by increasing the feed rate of the granular silicon material from the feeder to the feed pipe to be maintained so as to become equal to or higher than the discharge rate of the granular silicon material from the feed pipe to the silicon melt.

However, the discharge rate of the granular silicon material from the feed pipe to the silicon melt varies according to the state of an internal wall of the feed pipe, the structure and diameter of the tip end of the feed pipe, a distribution of particle size of the granular silicon material, and the state of the surface of the granular silicon material. However, the discharge rate of the granular silicon material may significantly change as a result of sudden collapse of the silicon material stagnated on the silicon melt, and, in this event, it is difficult to match the feed rate of the granular silicon material from the feeder to the feed pipe to this discharge rate in a superiorly responsive manner. Therefore, there is a risk of the granular silicon material stagnated in the feed pipe momentarily disappearing as a result of flowing into the silicon melt. To prevent such a risk, the maximum discharge rate of the granular silicon material from the feed pipe to the silicon melt is previously estimated, and the granular silicon material is fed from the feeder to the feed pipe at a rate equal to or higher than the maximum discharge rate.

In the case where the feeder is made of common metal such as SUS (stainless steel), in order to prevent the metal from being mixed into the silicon melt as a result of the granular silicon material from coming into direct contact with the metal, the internal surface of the feeder is coated or lined with material such as fluororesin that is hardly contaminated by heavy metal. However, the coating or lining is susceptible to abrasion if the feed rate of the granular silicon material from the feeder to the feed pipe is large.

In the case where a feeder formed from quartz or silicon is used, there arise no problems even if the granular silicon material comes into direct contact with the feeder. The internal surface of the feeder is covered with neither a coating nor a lining, and therefore the foregoing problem will not arise. However, the feeder made of quartz or silicon is relatively fragile. For this reason, if the feed rate of the granular silicon material from the feeder to the feed pipe is high, vibrations of the feeder must be increased, thereby resulting in fracture of the feeder.

In view of the previously-described problems, a feed rate of the granular silicon material from the feeder to the feed pipe is desired to be as low as possible.

SUMMARY OF THE INVENTION

A first major object of the present invention is to provide a method of feeding silicon material so as to be able to maintain granular silicon material stagnated in a feed pipe without abrading a coating or lining which covers an internal surface of a feeder or without damaging the feeder.

To achieve the first object, the present invention provides a method of feeding granular silicon material to silicon melt stored in a crucible through a feed pipe when a silicon monocrystal is manufactured using the Czochralski method. In this method, granular silicon material is first fed to the feed pipe from a feeder so as to stagnate the granular silicon material in the feed pipe. Commencement and stoppage of feeding of the granular silicon material from the feeder to the feed pipe are repeated so as to maintain the stagnation of the granular silicon material in the feed pipe. At this time, the feed rate of the granular silicon material from the feeder to the feed pipe is increased with time from the commencement of feeding of the granular silicon material to the stoppage of the feeding of the same.

The term "stagnation" is used herein to refer to a state in which at least part of the feed pipe is filled with granular silicon material, including the case where the filled granular silicon is stationary, the case where the filled granular silicon is gradually lowered, and the case where the filled granular silicon repeats the stationary and lowering states.

The granular silicon material is preferably maintained so as to stagnate in the feed pipe such that the amount of granular silicon material stagnated in the feed pipe is smaller than a given amount.

More preferably, the feed rate of the granular silicon material from the feeder to the feed pipe is increased so as to satisfy the following expression:

Feed rate of the granular silicon material=$C^t$ where C is a constant, and "t" designates a time which has elapsed from the commencement of feeding of the granular silicon material from the feeder to the feed pipe.

According to the present invention, the feed rate of the granular silicon material from the feeder to the feed pipe increases with time. Even if the feed rate of the granular silicon material is low at the time of commencement of the feeding of the granular silicon material, it often becomes considerably large when the feeding of the granular silicon material is stopped. However, since the feed rate of the granular silicon material gradually increases or a period of time during which the feed rate remains high is short, it is considered that abrasion of a coating or lining provided on the internal surface of the feeder or damage to the feeder does not occur or is less likely to occur.

Further, according to the present invention, since the feed rate of the granular silicon material from the feeder to the feed pipe increases with time, it is possible to restore the granular silicon material stagnated in the feed pipe to its original state within a short period of time even if a discharge rate of the granular silicon material from the feed pipe to the silicon melt suddenly becomes high. Therefore, the granular silicon material stagnated in the feed pipe is prevented from disappearing.

A second major object of the present invention is to provide a method and a feed pipe which are suitable for use with a molten or solidified surface of silicon melt; and which are capable of quickly adding silicon material without damaging a quartz crucible, thereby resulting in improved productivity and manufacturing yield of silicon monocrystals.

To achieve the second object, the present invention provides a method of feeding granular silicon material to silicon melt stored in a crucible in a pulling apparatus which is operated in accordance with the Czochralski method. In the feeding method, the granular silicon material is fed to a molten or solidified surface of the silicon melt through a feed pipe in a state in which the tip end of the feed pipe is in close proximity to the molten surface or in close proximity to or direct contact with the solidified surface of the silicon melt, thereby causing the granular silicon material to stagnate in the feed pipe. Subsequently, the crucible is lowered or the feed pipe is raised while the stagnation of the granular silicon material in the feed pipe is maintained, thereby forming an unmolten layer of the granular silicon material on the molten or solidified surface of the silicon melt. The unmolten layer is then melted, and the granular silicon material is fed onto the unmolten layer through the feed pipe while the stagnation of the granular silicon material in the feed pipe is maintained.

Further, the present invention provides a feed pipe for feeding granular silicon material to silicon melt stored in a crucible in a pulling apparatus which is operated according to the Czochralski method. The feed pipe has a mechanism for allowing the feed pipe to slide upwardly.

Furthermore, the present invention provides a feed pipe for feeding granular silicon material to silicon melt stored in a crucible in a pulling apparatus which is operated according to the Czochralski method. The tip end of the feed pipe is cut such that the end face of the tip end becomes parallel to a molten or solidified surface.

In the feeding method of the present invention, the stagnation of the granular silicon material and the formation of the unmolten layer are preferably carried out by feeding the granular silicon material at a fast rate equal to or greater than 4 kg/minute. In the case where the granular silicon material is fed on a molten surface of the silicon melt, the molten surface has a high temperature. If the feed rate of the granular silicon material is as slow as a melting rate of the unmolten layer, the granular silicon material stagnated in the feed pipe is heated to a considerably high temperature, so that in some cases, the granular silicon material is melted, which may clog the feed pipe. To prevent such a problem, the granular silicon material is fed at a fast rate equal to or greater than 4 kg/minute so as to quickly form a stagnant and an unmolten layer of the granular silicon material. The unmolten layer is intended to decrease the temperature of the silicon melt and to prevent radiation of heat from the silicon melt. Even in the case where granular silicon material is fed to a solidified surface of the silicon melt, it is desirable to feed the granular silicon material at such a fast speed as more than 4 kg/minute in order to reduce the time required to form stagnation of the granular silicon material in the feed pipe.

In the feeding method of the present invention, it is desirable to feed the granular silicon material onto the unmolten layer at the same speed as that at which the unmolten layer is melted. This can be realized by feeding the granular silicon material to the unmolten layer such that a constant thickness of the unmolten layer is maintained. The melting rate of the unmolten layer and the feed rate of the granular silicon material used herein do not signify momentary melting and feed rates but indicate mean melting and feed rates over at a certain period of time. Further, the "same rate" used herein includes the conception of a substantially-identical rate.

To maintain the thickness of the unmolten layer constant at all times, it is desirable to lower the crucible or to raise the feed pipe in accordance with the elevation of the molten surface of the silicon melt resulting from the melting of the unmolten layer.

Further, to increase the accuracy of the feed amount, it is desirable to feed several hundred grams of the last portion of the granular silicon material to be supplied at such an extremely slow rate as 0.3 kg/min or less.

In the feeding method of the present invention, it is preferred that the tip end of the feed pipe be offset from the center of the crucible by a distance corresponding to ¼–¾ of the radius of the crucible, and formation of an unmolten layer of the granular silicon material, melting of the unmolten layer, and feed of the granular silicon material to the unmolten layer be performed while the crucible is rotated. If the crucible is rotated in a state in which the tip of the feed pipe is located at a position that is offset from the center of the crucible by a distance corresponding to ¼ to ¾ of the radius of the crucible, the portion of the unmolten layer of the granular silicon material formed on the molten or solidified surface of the silicon melt becomes large. Consequently, the melting rate of the unmolten layer becomes high, which makes it possible to increase the feed rate of the granular silicon material to the unmolten layer. Further, it becomes possible to smoothly feed the granular silicon material to the silicon melt, which prevents clogging of the feed pipe. More specifically, decrease in the thickness of the unmolten layer associated with the melting of the unmolten layer occurs intermittently. If the crucible is not rotated, the feeding of the granular silicon material to the unmolten layer through the feed pipe becomes intermittent, so that there continues a state in which the granular silicon material does not move in the feed pipe and eventually becomes melted, which may result in clogging of the feed pipe. However, rotation of the crucible makes it possible to continuously feed the granular silicon material to the unmolten layer. Accordingly, the granular silicon material can be constantly placed in a state in which it always moves in the feed pipe, which in turn makes it possible to prevent clogging of the feed pipe.

The reason why the distance between the tip end of the feed pipe and the center of the crucible is set to ¼ to ¾ of the radius of the crucible is as follows. Namely, if the distance between the tip end of the feed pipe and the center of the crucible is set to less than ¼ of the radius of the crucible, the unmolten layer of the granular silicon material will be formed in the vicinity of the crucible center. In such a case, even if an attempt is made to melt the unmolten layer by heating with a heater, the melting rate becomes too low because the unmolten layer is spaced away from the heater disposed to surround the crucible. If an attempt is made to increase the melting rate, a stronger heating operation will become necessary, which may cause damage to the crucible.

The reason why the distance between the tip end of the feed pipe and the center of the crucible is set to more than ¾ of the radius of the crucible is as follows. Namely, if the distance between the tip end of the feed pipe and the center of the crucible is set to more than ¾ of the radius of the crucible, a resultantly-formed unmolten layer may stick to the wall of the crucible. More specifically, the melting of the unmolten layer and the feeding of the granular silicon material to the unmolten layer are carried out through the repetition of: creation of a hollow through melting of the portion of the unmolten layer that is in contact with the silicon melt; fall of the portion of the granular silicon material above the thus-created hollow so as to fill the space; and feeding of the granular silicon material to a hollow resulting from the fall of the portion of the stagnating granular silicon material. In this way, smooth fall of the portion of the granular silicon material above the hollow formed as a result of melting of the unmolten layer is required. If the unmolten layer sticks to the wall of the crucible, the granular silicon material will not fall smoothly, which in turn will stop feeding of the granular silicon material. In this case, the granular silicon material stagnated in the feed pipe is melted to block the feed pipe.

When the melting of the unmolten layer and the feeding of the granular silicon material to the unmolten layer are carried out, it is desirable to set the relationship between the mean lowering rate (mm/minute) of the crucible or the mean raising rate (mm/minute) of the feed pipe and the mean rotating speed (rpm) of the crucible so as to satisfy the following expression: 1≦{a mean lowering rate of the crucible or a mean raising rate of the feed pipe×(1/a mean rotating speed of the crucible)}.

By virtue of such a setting, it is possible to prevent a problem that feeding of the granular silicon material to the unmolten layer must be stopped for reasons of a delay in the lowering action of the crucible or a delay in the melting of the unmolten layer resulting from excessively-quick rotation of the crucible. As a result, it is possible to continuously feed the granular silicon material to the unmolten layer. If the foregoing relationship is set so as to satisfy the above-described expression, the mean rotating speed of the crucible becomes smaller than 1 (rpm); for example, in the case where the mean lowering rate of the crucible is 1 mm/minute.

It is desirable to interlock the rotation of the crucible with the lowering operation of the crucible or the raising operation of the feed pipe. More specifically, it is desirable to rotate the crucible when the crucible is lowered or the feed pipe is raised, whereas it is desirable to maintain the crucible stationary when neither the lowering of the crucible nor the raising of the feed pipe is carried out. As a result, it is possible to smoothly feed the granular silicon material to the unmolten layer.

BRIEF DESCRIPTION OF THE DRAWINGS

FIGS. 6A to 6D are vertically sectioned partial views showing variations in the position of a feed pipe, the position of a molten surface, and the state of the granular silicon material when the granular silicon material is supplied onto the molten surface of silicon melt according to a feeding method of the present invention;

PREFERRED EMBODIMENTS OF THE PRESENT INVENTION

First Embodiment

A first embodiment of the present invention will now be described with reference to FIGS. 3 and 4. In the present embodiment, a description will be given of a method of feeding granular silicon material when a silicon monocrystal is manufactured using the multi-pulling method. However, it goes without saying that the feeding method can be applied to the case where a silicon monocrystal is manufactured using the CCZ method.

Figure 1:
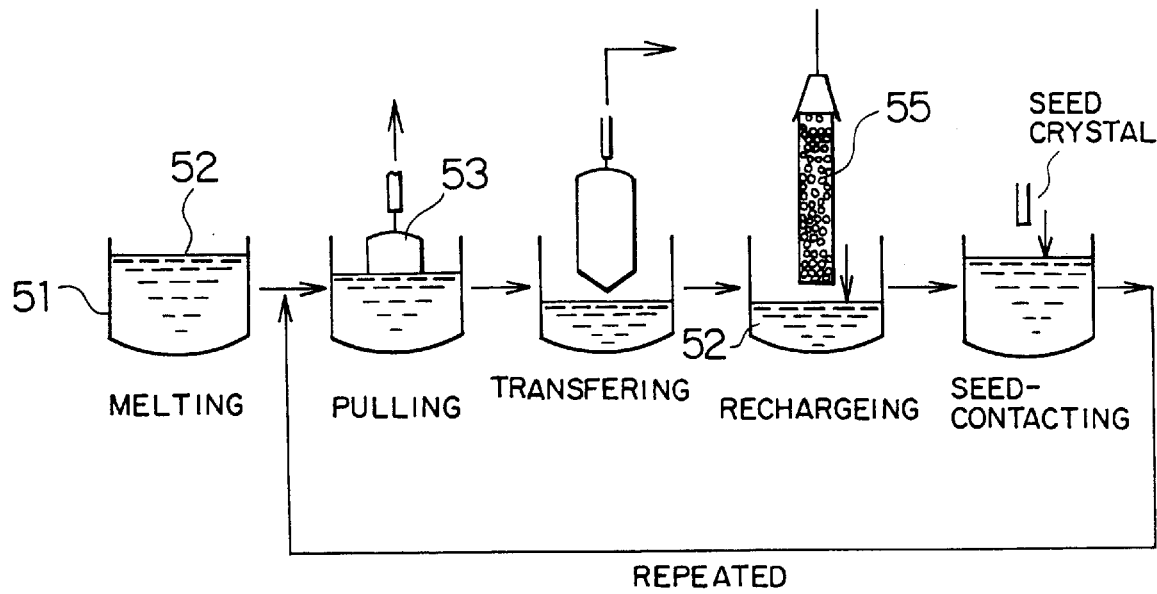
FIG. 1 is a schematic diagram showing a conventional method for recharging silicon material.
Figure 2:
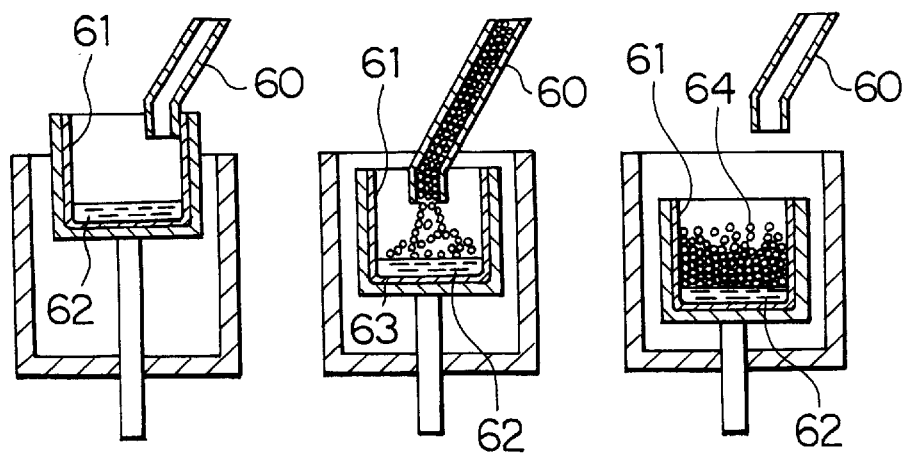
FIG. 2 are schematic views showing another conventional method for recharging silicon material.
Figure 3:
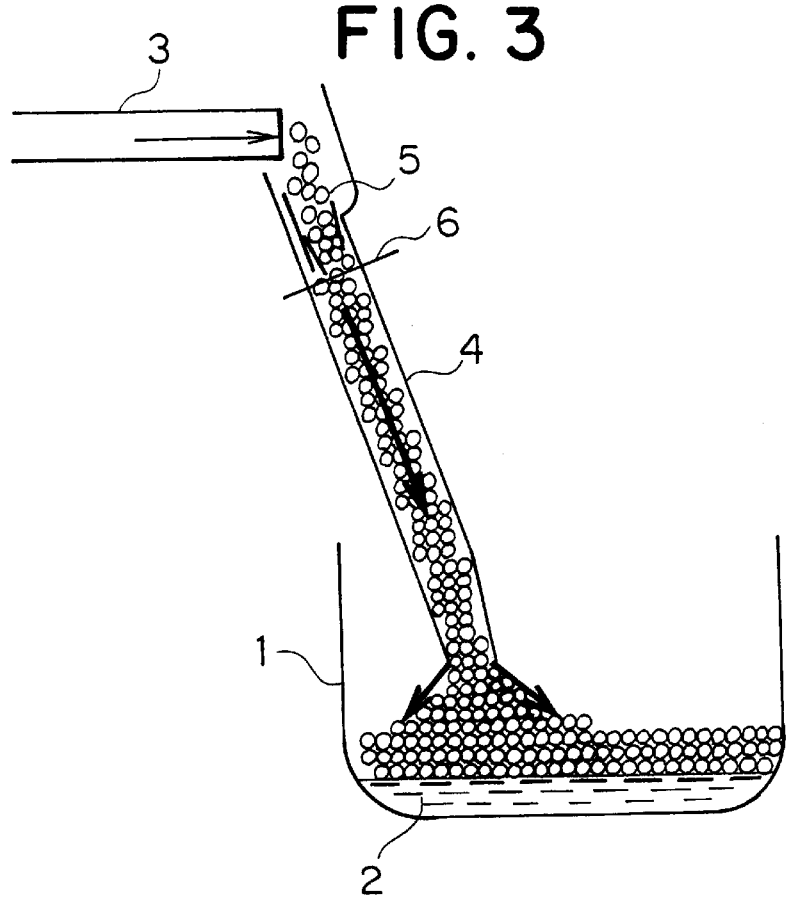
FIG. 3 is a schematic view showing an example of an apparatus used in manufacturing a silicon monocrystal according to the present invention.

FIG. 3 is a schematic cross section showing one example of an apparatus for manufacturing a silicon monocrystal to which the present invention is applied.

As shown in FIG. 3, granular silicon material 5 is recharged to silicon melt 2 which remains in a crucible 1 after a silicon monocrystal has been pulled, through a feed pipe 4 from a feeder 3. At this time, the granular silicon material 5 is first caused to stagnate in the feed pipe 4.

Subsequently, the granular silicon material 5 is supplied from the feeder 3 to the feed pipe 4 so as to maintain the granular silicon material 5 stagnated in the feed pipe 4 until supply of the granular silicon material 5 to the silicon melt 2 is completed. At this time, the amount of the granular silicon material 5 stagnated in the feed pipe 4 is detected by a sensor (not shown) attached to the outside of an upper portion of the feed pipe 4. Based on the output from the sensor, the supply of granular silicon material from the feeder 3 is controlled. Through repetition of commencement and stoppage of the supply of the granular silicon material, the amount of the granular silicon material 5 is maintained to be equal to or less than a given amount indicated by numeral 6. The crucible 1 is rotatable and is vertically movable by an unillustrated shaft that is rotatable and vertically movable. The discharge rate of the granular silicon material 5 from the feed pipe 4 to the silicon melt 2 can be changed by rotating and lowering the crucible 1 using the shaft.

To maintain the granular silicon material stagnated in the feed pipe, the initial amount of stagnated silicon material, the feed rate of the granular silicon material from the feeder to the feed pipe, and the discharge rate of the granular silicon material from the feed pipe to the silicon melt must satisfy the following relationship: the initial amount of stagnated silicon material $$\int_0^t$$

(the feed rate of granular silicon material from the feeder to the feed pipe—the discharge rate of the granular silicon material from the feed pipe to the silicon melt) dt>0 where "t" is a time which has elapsed from commencement of supply of the granular silicon material from the feeder to the feed pipe.

Even if the feed rate of the granular silicon material from the feeder to the feed pipe is changed, the granular silicon material stagnated in the feed pipe can be maintained so long as the above-described relationship is satisfied.

In the present invention, the above-described relationship is satisfied by increasing the feed rate of the granular silicon material from the feeder to the feed pipe with time.

More specifically, when the feed rate of the granular silicon material from the feeder to the feed pipe is smaller than the discharge rate of the granular silicon material from the feed pipe to the silicon melt when the feed of the granular silicon material is commenced, the amount of granular silicon material stagnated in the feed pipe is reduced. However, the feed rate of the granular silicon material from the feeder to the feed pipe increases with time, the degree of reduction in the stagnated granular silicon material becomes gradually smaller. Before long, the amount of stagnated granular silicon material increases, whereby the stagnation of the granular silicon material in the feed pipe is maintained.

In this case, the feed rate of the granular silicon material from the feeder to the feed pipe is set to any suitable function which increases with time; for example, C xt or C$^t$ (where C is a constant, and "t" is a time which has elapsed from the commencement of supply of the granular silicon material from the feeder to the feed pipe).

Figure 4:
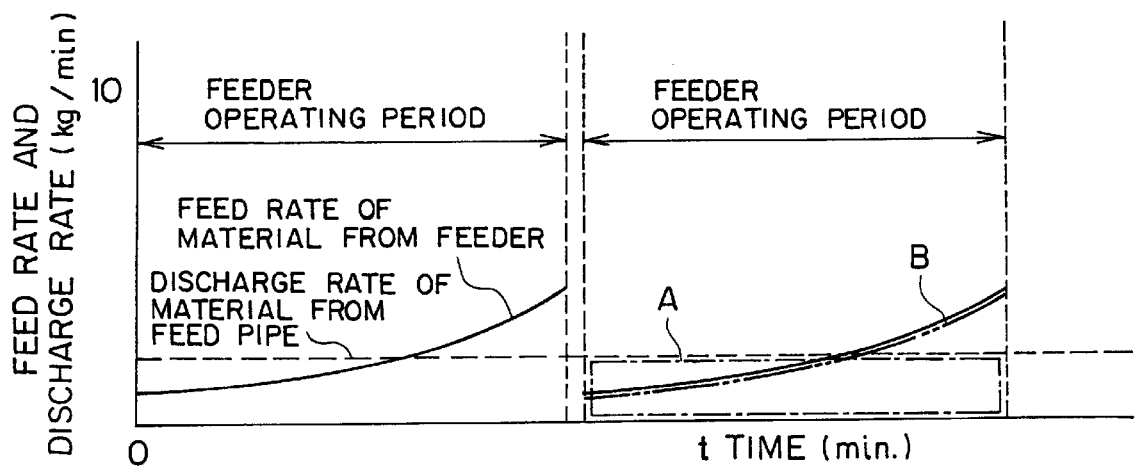
FIG. 4 is a graph showing an example of the relationship between a feed rate of granular silicon material to a feed pipe and a discharge rate of the granular silicon material from the feed pipe to silicon melt when the feed rate of the granular silicon material to the feed pipe is increased according to a method of the present invention.

FIG. 4 is a graph showing the relationship between the feed rate of the granular silicon material from the feeder to the feed pipe (i.e., the feed rate of the granular silicon material from the feeder) and the discharge rate of the granular silicon material from the feed pipe to the silicon melt (i.e., the discharge rate of the granular silicon material from the feed pipe) in the case where the feed rate of the granular silicon material to the feed pipe is increased according to the present invention. FIG. 4 shows the case where the discharge rate of the granular silicon material from the feed pipe to the silicon melt is constant. However, the discharge rate usually changes in an irregular manner. As shown in FIG. 4, the area surrounded by a chain line A can be made equal to the area surrounded by a two-dot chain line B by increasing the feed rate of the granular silicon material to the feed pipe with time. As a result, the previously-described relationship can be satisfied, whereby the granular silicon material stagnated in the feed pipe can be maintained.

EXAMPLE

A test example of the present embodiment will now be described. However, the present invention is not limited to that example.

In the test, there were used a vibration feeder formed from SUS and having an interior surface coated with fluororesin and an apparatus as illustrated in FIG. 3 capable of changing a discharge rate of the granular silicon material from the feed pipe to the silicon melt. Granular silicon material having a total amount of 33 kg was recharged into silicon melt after a silicon monocrystal had been pulled At this time, commencement and stoppage of supply of the granular silicon material from the vibration feeder to the feed pipe were controlled by sensing the amount of the granular silicon material stagnated in the feed pipe using an optical sensor provided on the outside of an upper portion of the feed pipe.

It turned out that the discharge rate of the granular silicon material from the feed pipe to the silicon melt was changed in the range from 0 kg/minute to 1 kg/minute.

The feed rate (kg/minute) of the granular silicon material from the feeder to the feed pipe was set to $50^t$, where "t" is a time (in minutes) which has elapsed from commencement of supply of the granular silicon material from the feeder to feed pipe.

In consequence, when the discharge rate of the granular silicon material from the feed pipe to the silicon melt is low, ten and several seconds elapsed from the commencement of supply of the granular silicon material from the feeder to the feed pipe to stoppage of supply of the granular silicon material. Even in the case of a high discharge rate, the quantity of the granular silicon material stagnated in the feed pipe returned to its original state within 30 seconds, whereby the granular silicon material remained to stagnate in the feed pipe.

Further, no particular abrasion of the fluororesin coating provided on the internal surface of the feeder was observed.

According to the present invention, neither abrasion of the coating or lining provided on the internal surface of the feeder nor breakage of the feeder occurred. The granular silicon material can be supplied to the feed pipe from the feeder while stagnation of the granular silicon material in the feed pipe is maintained. It is possible to manufacture a longer silicon monocrystal or an increased number of silicon monocrystals using the multi-pulling method or the continuous Czochralski method, whereby manufacturing costs of the silicon monocrystal can be reduced to a greater extent.

Second Embodiment

A second embodiment of the present invention will now be described with reference to FIGS. 5–8.

Figure 5:
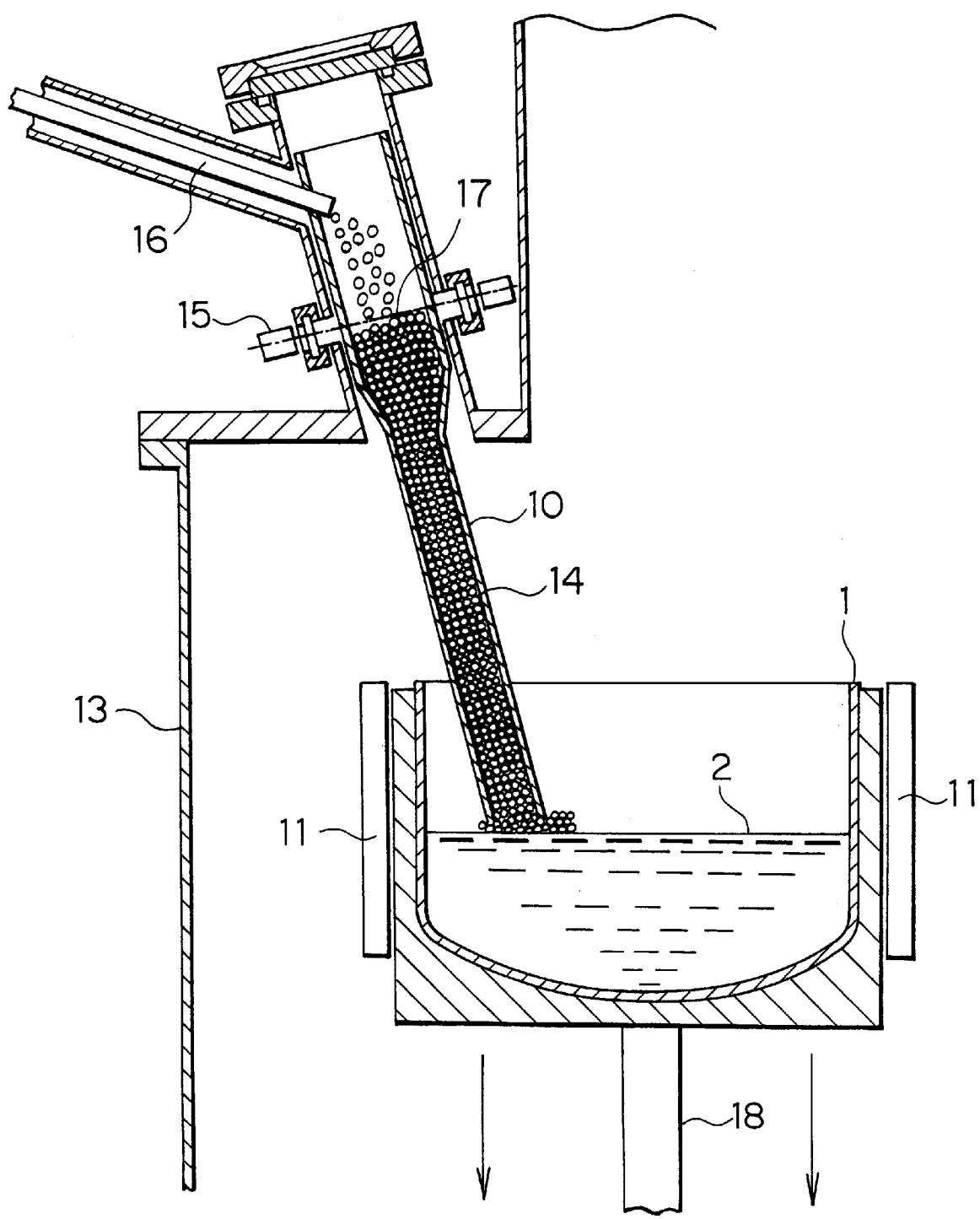
FIG. 5 is a vertical cross sectional few of an example of a feeding apparatus for use in practicing the present invention.

FIG. 5 is a longitudinal cross section showing one example of a feeding apparatus for use in practicing the present invention.

As shown in FIG. 5, granular silicon material 14 is fed onto a molten or solidified surface of silicon melt 2 stored in a quartz crucible 1 through a feed pipe 10. The tip end of the feed pipe 10 is offset from the center of the quartz crucible 1 by a distance corresponding to ¼ to ¾, or more preferably ½ to ¾, of the radius of the crucible. A sensor 15 capable of sensing the quantity of the stagnated granular silicon material 14 is provided on the outside of the feed pipe 10. A feeder 16 is provided in communication with an upper portion of the feed pipe 10 so as to feed the granular silicon material 14 to the feed pipe 10. When the sensor 15 detects that the quantity of the granular silicon material 14 stagnated in the feed pipe 10 exceeds a given amount indicated by numeral 17, the supply of the granular silicon material from the feeder 16 is reduced or stopped such that the amount of the granular silicon material 14 stagnated in the feed pipe 10 remains to become smaller than the given amount 17 continuously. The crucible 1 can be lowered or rotated by means of a shaft 18. The silicon melt contained in the crucible 1 and the granular silicon material are heated by the heater 11. Numeral 13 in FIG. 5 denotes a chamber.

FIGS. 6A to 6D are vertically sectioned partial views showing variations in the position of a feed pipe 20, the position of a molten surface 22, and the state of granular silicon material 24 when the granular silicon material 24 is supplied onto the molten surface 22 of silicon melt according to a feeding method of the present invention.

As shown in FIG. 6A, the tip end of the feed pipe 20 is brought into proximity to the molten surface 22. Although varying according to the shape and diameter of the tip end of the feed pipe or the size of the crucible, the distance between the tip end of the feed pipe 20 and the molten surface 22 is usually set to a distance in the range from 5 to 10 mm. A shorter distance is preferable to stagnate the granular silicon material in the feed pipe quickly. However, the distance between the tip end of the feed pipe 20 and the molten surface 22 is usually set to be in the range from 5 to 10 mm because of the following reason. If the distance is shorter than 5 mm, the silicon melt splashed as a result of supply of the granular silicon material to the molten surface is apt to attach to the tip end of the feed pipe. If the distance is longer than 10 mm, there will arise a risk of the granular silicon material rebounding from the molten surface and scattering therearound. Further, in this event, it takes much too long to stagnate the granular silicon material in the feed pipe.

As shown in FIGS. 6A to 6D, the feed pipe 20 should preferably have its tip end cut so as to become parallel to the molten surface. With such a tip end, the granular silicon material stagnates in the feed pipe more quickly. Moreover, a symmetrical meniscus can be obtained. As a result, when the granular silicon material is supplied at the same slow rate as that at which an unmolten layer is melted, or when the granular silicon material is supplied at as slow a rate as 0.3 kg/minute or less, the granular silicon material can be supplied stably.

Subsequently, as shown in FIGS. 6B to 6D, the granular silicon layer 24 is stagnated, and the unmolten layer is formed. To these ends, the granular silicon material is preferably supplied at such a fast rate as 4 kg/minute or more. The reason for this is that quick formation of the unmolten layer results in reduction in the temperature of the silicon melt, prevention of radiation of heat from the silicon melt, and blocking of the feed pipe resulting from melting of granular silicon material by the radiant heat.

The unmolten layer is formed by lowering the crucible or raising the feed pipe 20 while stagnation of the granular silicon material in the feed pipe is maintained, and by rotating the crucible. If the thickness of the unmolten layer is too large, the portion of the granular silicon material situated above a hollow formed as a result of melting of the unmolten layer will not smoothly fall. For this reason, it is suitable to set the thickness of the unmolten layer to such an extent that the silicon melt becomes invisible. A specific thickness of the unmolten layer varies according to the size of a main chamber, the diameter of the crucible, the shape of a hot zone, and heater power.

The unmolten layer is melted, and the granular silicon material is supplied onto the unmolten layer via the feed pipe while the granular silicon material is maintained to stagnate in the feed pipe. The granular silicon material is supplied to the unmolten layer at the same rate as that at which the unmolten layer is melted so as to continuously keep the thickness of the unmolten layer constant. As the unmolten layer is melted, the molten surface of the silicon melt rises. Therefore, the crucible is lowered so as to compensate for the rise in level of the molten surface. To smoothly supply the granular silicon material to the unmolten layer, the crucible is rotated at an appropriate rotating speed. It is preferable to interlock the lowering action of the crucible with the rotation of the crucible.

In the case where the granular silicon material is supplied to the unmolten layer while the stagnation of the granular silicon material in the feed pipe is maintained, a melting rate of the unmolten layer can be increased by heating the granular silicon material stagnated in the feed pipe previously. This pre-heating of the granular silicon material is particularly effective in the case where the melting rate of the unmolten layer is small and the feed rate of the granular silicon material to the unmolten layer is therefore small. However, the heating of the granular silicon material stagnated in the feed pipe may cause fusion of the granular silicon material within the feed pipe. It was found that the granular silicon material can be prevented from fusing within the feed pipe by coating the outer surface of the feed pipe with material having low heat or light transmissivity such as opaque quartz, SiO, or SiC.

Finally, the accuracy of the feed rate was improved by supplying several hundred grams of the last portion of the granular silicon material to be supplied to the unmolten layer at such an extremely slow rate as 0.3 kg/minute or less.

FIGS. 7A through 7J are vertically sectioned partial views showing variations in the position of a feed pipe 30 made of quartz, the position of a solidified surface, and the state of granular silicon material 34 when the granular silicon material 34 is supplied onto the solidified surface of silicon melt according to the feeding method of the present invention.

Where polysilicon containing residual gas such as hydrogen or chlorine is used as the granular silicon material, the polysilicon is preferably supplied on to a solidified surface. The solidified surface is formed by solidifying the surface of the melt and the vicinity thereof. Such a granular silicon material may rupture by degassing, as a result of which the silicon melt splashes to the outside of the crucible. However, in the case where the granular silicon material is supplied onto the solidified surface according to the feeding method of the present invention, even when melting of the unmolten layer of the granular silicon material is commenced by fusing the solidified surface, only a lower portion of the unmolten layer is melted. The unmolten layer prevents silicon melt from splashing which would otherwise be caused by rupture of the residual-gas-containing polysilicon when it is degassed. Accordingly, the silicon material can be supplied while the influence of silicon splashes is minimized. Hydrogen can be eliminated from the polysilicon by heating. In contrast, there has not been found a method of eliminating chlorine from the polysilicon yet. Therefore, chlorine-containing polysilicon is very difficult to handle. The method of feeding silicon material onto a solidified surface of silicon melt, according to the present invention, allows use of chlorine-containing polysilicon as silicon material without any difficulties.

Figures 7A, 7B, 7C, 7D, 7E:
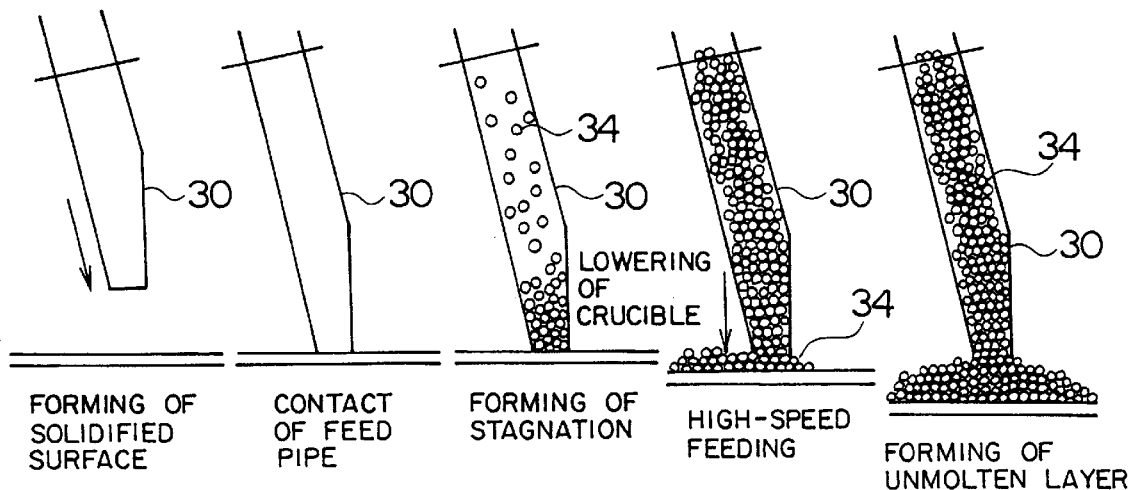
FIGS. 7A through 7J are vertically sectioned partial views showing variations in the position of a feed pipe, the position of a solidified surface, and the state of granular silicon material when the granular silicon material is supplied onto the solidified surface of the silicon melt according to the feeding method of the present invention.

As shown in FIGS. 7A and 7B, after a solidified surface of silicon melt has been formed, the tip end of the feed pipe 30 is brought into contact with or in proximity to the solidified surface. The distance between the tip end of the feed pipe and the solidified surface varies according to the shape and diameter of the tip end of the feed pipe or the size of the crucible. The distance is usually set to the range from 0 to 5 mm. If the distance is longer than 5 mm, the granular silicon material will sharply rebound from the solidified surface and scatter therearound. Also, the time required to stagnate the granular silicon material in the feed pipe becomes longer.

Figures 7F, 7G, 7H, 7I, 7J:
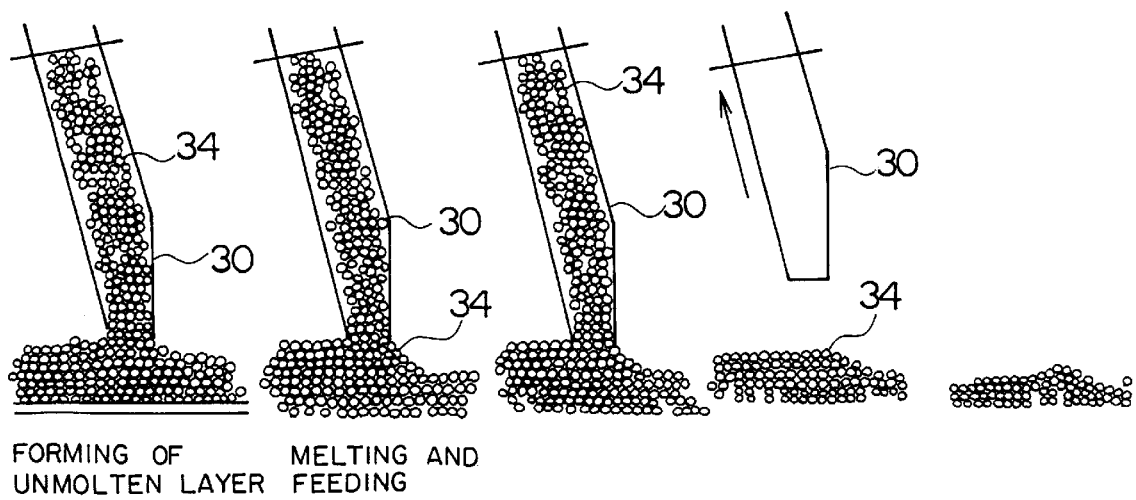
Figure 8:
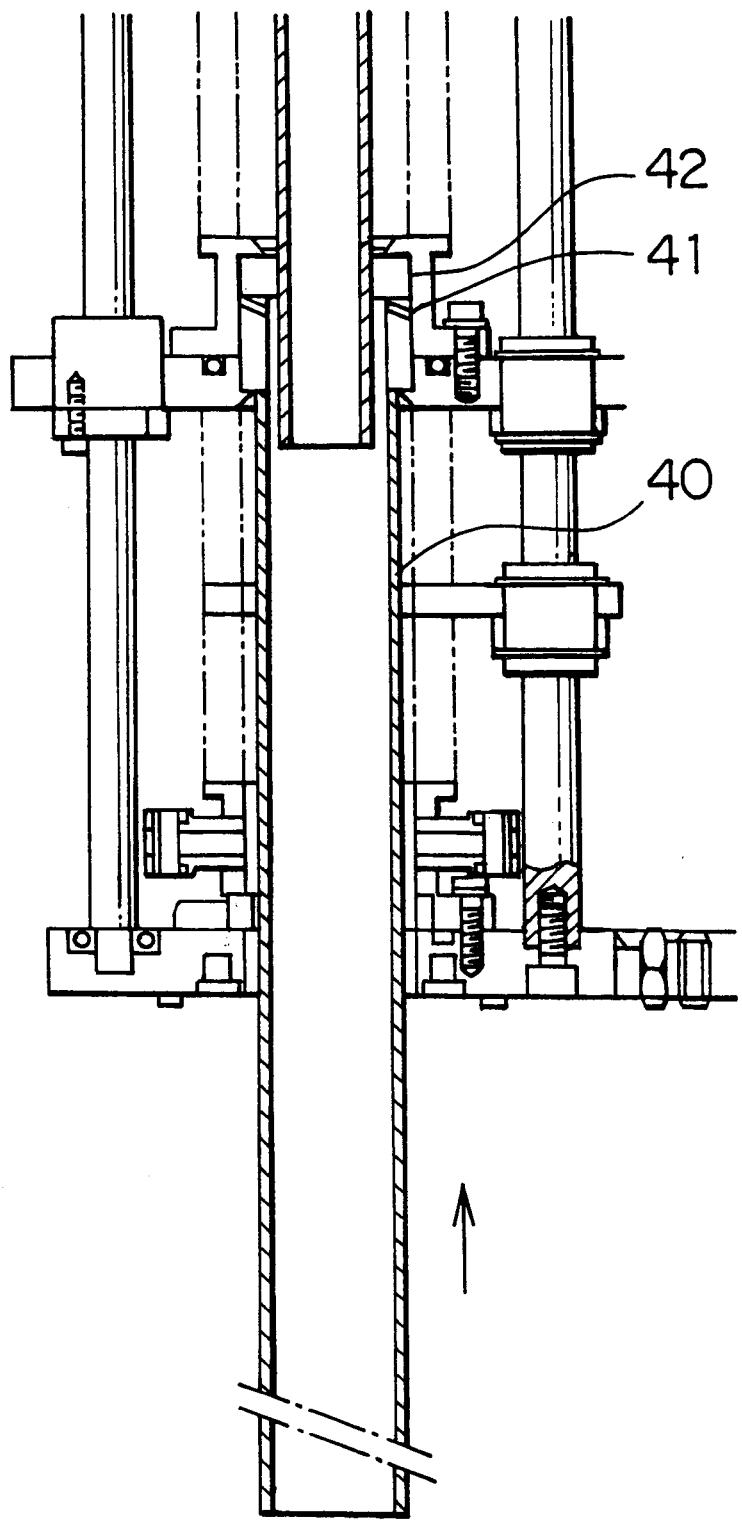
FIG. 8 is a schematic view showing an example of a feed pipe having a mechanism for upward sliding movement.

In the case where the tip end of the feed pipe is brought into contact with the solidified surface of the silicon melt, the feeding apparatus is preferably provided with a mechanism shown in FIG. 8. The mechanism allows the feed pipe to slide upward, thereby relieving shock arising as a result of a contact between the feed pipe and the solidified surface so as to prevent the feed pipe from being damaged even if the feed pipe comes into contact with the solidified surface. Further, as shown in FIGS. 7A to 7J, the tip end of the feed pipe is preferably cut so as to become parallel to the solidified surface.

Subsequently, as shown in FIGS. 7C–7F, the stagnation of the granular silicon material 34 and formation of an unmolten layer are carried out. The stagnation of the granular silicon material 34 and the formation of the unmolten layer is preferably carried out by feeding granular silicon material at such a fast speed as 4 kg/minute or more.

The unmolten layer is formed by rotating and lowering the crucible while the stagnation of the granular silicon material in the feed pipe is maintained.

Next, as shown in FIG. 7G, the solidified surface and unmolten layer of the silicon melt are melted while the crucible is rotated and lowered, and the granular silicon material 34 is supplied to the unmolten layer. The granular silicon material is supplied to the unmolten layer at the same rate as that at which the unmolten layer is melted. As a result, the thickness of the unmolten layer remains constant. The lowering action and rotation of the crucible are preferably interlocked with each other.

Finally, as shown in FIG. 7H, the accuracy of the feed rate is improved by supplying several hundred grams of the last portion of the granular silicon material to be supplied to the unmolten layer at such an extremely slow rate as 0.3 kg/minute or less.

FIG. 8 shows an example of a feed pipe having a mechanism for upward sliding movement according to the present invention. As shown in FIG. 8, the top of a quartz feed pipe 40 is formed into a flange 41. This quartz feed pipe 40 is freely suspended and is capable of sliding upwardly within a distance corresponding to a slide stroke 42. By virtue of this mechanism, the tip end of the feed pipe is prevented from being damaged even if it comes into contact with the solidified surface at the time of recharging the granular silicon material onto the solidified surface of the silicon melt.

Examples

Test examples of the method of feeding granular silicon material according to the present invention will be described hereinbelow.

Example 1: Feeding of granular silicon material onto a molten surface of silicon melt in the multi-pulling method.

After a first silicon monocrystal was pulled from silicon melt contained in a quartz crucible measuring 18 inches in diameter, hydrogen-degassed granular polysilicon having a total amount of 33 kg was supplied to the residual silicon melt in the following manner.

First, 3 kilograms of granular silicon material were supplied onto a molten surface of the silicon melt through a feed pipe at a rate of 4 kg/minute, whereby the granular silicon material was caused to stagnate in the feed pipe.

Subsequently, while the crucible was lowered at a rate of 100 mm/minute and rotated at a rotating speed of 1 rpm, 12 kilograms of granular silicon material were supplied to the molten surface at a rate of 4 kg/minute in a like manner, whereby an unmolten layer of granular silicon material was formed.

While the crucible was lowered at a rate of 1 mm/minute and rotated at a rotating speed of 0.1 rpm, 17.7 kilograms of granular silicon material were supplied at a rate of 0.3 kg/minute At this time, the thickness of the unmolten layer of granular silicon material remained unchanged.

Finally, while the crucible was lowered at a rate of 1 mm/minute and rotated at a rotating speed of 0.1 rpm, 300 grams of silicon material were supplied at a rate of 0.1 kg/minute.

In this way, according to the feeding method of the present invention, 33 kilograms of granular silicon material could be quickly recharged to the silicon melt, and the quartz crucible was found to be undamaged.

Example 2: Feeding of granular silicon material onto a solidified surface of silicon melt in the multi-pulling method.

After a first silicon monocrystal was pulled from silicon melt contained in a quartz crucible measuring 18 inches in diameter, chlorine-containing granular polysilicon having a total amount of 33 kg was supplied to the residual silicon melt in the following manner.

First, the surface of the residual silicon melt and the vicinity thereof were solidified, and then 1.5 kilograms of granular silicon material were supplied onto a solidified surface of the silicon melt through a feed pipe at a rate of 4 kg/minute, whereby the granular silicon material was caused to stagnate in the feed pipe.

Subsequently, while the crucible was lowered at a rate of 100 mm/minute and rotated at a rotating speed of 1 rpm, 10.5 kilograms of granular silicon material were supplied to the molten surface at a rate of 4 kg/minute in a like manner, whereby an unmolten layer of granular silicon material was formed.

The solidified surface of the silicon melt was then melted, and melting of the unmolten layer was commenced. At this time, while the crucible was lowered at a rate of 1 mm/minute and rotated at a rotating speed of 0.1 rpm, 20.7 kilograms of silicon material were supplied at a rate of 0.3 kg/minute. The thickness of the unmolten layer of silicon material remained unchanged.

Finally, while the crucible was lowered at a rate of 1 mm/minute and rotated at a rotating speed of 0.1 rpm, 300 grams of silicon material were supplied at a rate of 0.1 kg/minute.

As described above, according to the feeding method of the present invention, 33 kilograms of chlorine-containing granular silicon material could be quickly recharged to the silicon melt while the influence of splashes of silicon was prevented. The quartz crucible was found to be undamaged.

According to the present embodiment, it is possible to quickly add silicon material onto either a molten surface or a solidified surface of silicon melt without damaging a quartz crucible, as a result of which the productivity and manufacturing yield of silicon monocrystals are improved.

The present invention is not limited to the above-described embodiments. The above-described embodiments are mere examples, and those having the substantially same structure as that described in the appended claims and providing the similar action and effects are included in the scope of the present invention.

What is claimed is:

1. A method of feeding granular silicon material to a silicon melt stored in a crucible through a feed pipe when a silicon monocrystal is manufactured using the Czochralski method, said method comprising the steps of:

feeding granular silicon material to the feed pipe from a feeder so as to form stagnation of the granular silicon material in the feed pipe; and repeating commencement and stoppage of feeding of the granular silicon material from the feeder to the feed pipe so as to maintain the stagnation of the granular silicon material in the feed pipe, wherein the feed rate of the granular silicon material from the feeder to the feed pipe is increased with time from the commencement of feeding of the granular silicon material to the stoppage of the feeding of the granular silicon material.

2. A method of feeding granular silicon material according to claim 1, wherein the stagnation of the granular silicon material is maintained such that the amount of the granular silicon material stagnated in the feed pipe becomes equal to or less than a given amount.

3. A method of feeding granular silicon material according to claim 2, wherein the feed rate of the granular silicon material from the feeder to the feed pipe is increased so as to satisfy the following expression:

feed rate of the granular silicon material=$C^t$ where C is a constant, and t is an amount of time which has elapsed from the commencement of feeding of the granular silicon material from the feeder to the feed pipe.

4. A method of feeding granular silicon material according to claim 1, wherein the feed rate of the granular silicon material from the feeder to the feed pipe is increased so as to satisfy the following expression:

feed rate of the granular silicon material=$C^t$ where C is a constant, and t is an amount of time which has elapsed from the commencement of feeding of the granular silicon material from the feeder to the feed pipe.

5. A method of manufacturing a plurality of silicon monocrystals using a single crucible according to the Czochralski method, wherein granular silicon material is recharged into a silicon melt stored in the crucible via a feed pipe between pulling of a silicon monocrystal and pulling of a subsequent silicon monocrystal, the method comprising:

a) pulling a silicon monocrystal from the silicon melt;

b) recharging the granular silicon material into the silicon melt according to the method of claim 1; and c) subsequently to step (b) pulling another silicon monocrystal from the silicon melt.

6. A method of manufacturing a silicon monocrystal according to the Czochralski method while granular silicon material is charged into a silicon melt stored in a crucible via a feed pipe, the method comprising:

a) pulling a silicon monocrystal from the silicon melt; and b) recharging the granular silicon material into the silicon melt according to the method of claim 1.

7. A method of feeding granular silicon material according to claim 1, further comprising sliding the feed pipe upwardly relative to the silicon melt.

8. A method of feeding granular silicon material according to claim 1, further comprising maintaining a tip end of the feed pipe parallel to a molten or solidified surface of the silicon melt.

9. A method of recharging granular silicon material to a silicon melt stored in a crucible through a feed pipe when a plurality of silicon monocrystals are manufactured using a single crucible according to the Czochralski method, wherein the recharging is performed between pulling of a silicon monocrystal and pulling of a subsequent silicon monocrystal, said method comprising the steps of:

feeding the granular silicon material to a molten or solidified surface of the silicon melt stored in a crucible through a feed pipe in a state in which a tip end of the feed pipe is (i) in close proximity to the molten surfaces, or (ii) in close proximity to, or in direct contact with, the solidified surface of the silicon melt, thereby causing the granular silicon material to stagnate in the feed pipe;

lowering the crucible or raising the feed pipe while maintaining the stagnation of the granular silicon material in the feed pipe so as to form an unmolten layer of the granular silicon material on the molten or solidified surface of the silicon melt;

melting the unmolten layer, and feeding the granular silicon material onto the unmolten layer through the feed pipe while maintaining the stagnation of the granular silicon material in the feed pipe.

10. A method of feeding granular silicon material according to claim 9, wherein the stagnation of the granular silicon material and the unmolten layer are formed by feeding the granular silicon material at a rate equal to or greater than 4 kg/minute.

11. A method of feeding granular silicon material according to claim 9, wherein the granular silicon material is fed onto the unmolten layer at the same speed as that at which the unmolten layer is melted.

12. A method of feeding granular silicon material according to claim 11, wherein when melting of the unmolten layer and supply of the granular silicon material are carried out, the crucible is lowered or the feed pipe is raised in accordance with the elevation of the molten surface of the silicon melt.

13. A method of feeding granular silicon material according to claim 9, wherein the stagnation of the granular silicon material and the unmolten layer are formed by feeding the granular silicon material at a rate equal to or greater than 4 kg/minute, the granular silicon material is fed onto the unmolten layer at the same speed as that at which the unmolten layer is melted, and several hundred grams of a last portion of the granular silicon material is supplied at a rate equal to or less than 0.3 kg/min so as to increase the accuracy of the feed amount.

14. A method of feeding granular silicon material according to claim 13, wherein the tip end of the feed pipe is offset from the center of the crucible by a distance corresponding to ¼–¾ of a radius of the crucible, and formation of the unmolten layer of the granular silicon material, melting of the unmolten layer, and feed of the granular silicon material to the unmolten layer are performed while the crucible is rotated.

15. A method of feeding granular silicon material according to claim 13, wherein when the melting of the unmolten layer and supply of the granular silicon material to the unmolten layer are carried out, the mean lowering rate of the crucible or the mean raising rate of the feed pipe, and the mean rotting speed of the crucible satisfy the following relationship:

$1 \leq \{$the mean lowering rate of the crucible or the mean raising rate of the feed pipe$\times(1/$the mean rotating speed of the crucible$)\}$.

16. A method of feeding granular silicon material according to claim 13, wherein the rotation of the crucible is interlocked with the lowering operation of the crucible or the raising operation of the feed pipe.

17. A method of feeding granular silicon material according to claim 9, wherein the tip end of the feed pipe is offset from the center of the crucible by a distance corresponding to ¼–¾ of a radius of the crucible, and formation of the umnolten layer of the granular silicon material, melting of the unmolten layer, and feed of the granular silicon material to the unmolten layer are performed while the crucible is rotated.

18. A method of feeding granular silicon material according to claim 17, wherein when the melting of the unmolten layer and supply of the granular silicon material to the unmolten layer are carried out, the mean lowering rate of the crucible or the mean raising rate of the feed pipe, and the mean rotating speed of the crucible satisfy the following relationship:

$1 \leq \{$the mean lowering rate of the crucible or the mean raising rate of the feed pipe$\times(1/$the mean rotating speed of the crucible$)\}$.

19. A method of feeding granular silicon material according to claim 17, wherein the rotation of the crucible is interlocked with the lowering operation of the crucible or the raising operation of the feed pipe.

20. A method of feeding granular silicon material according to claim 9, wherein commencement and stoppage of feeding of the granular silicon material from the feeder to the feed pipe is repeated so as to maintain the stagnation of the granular silicon material in the feed pipe, and the feed rate of the granular silicon material from the feeder to the feed pipe is increased with time from the commencement of feeding of the granular silicon material to the stoppage of the feeding of the granular silicon material.

21. A method of manufacturing a plurality of silicon monocrystals using a single crucible according to the Czochralski method, wherein granular silicon material is recharged into silicon melt stored in the crucible via a feed pipe between pulling of a silicon monocrystal and pulling of a subsequent silicon monocrystal, the method comprising:

a) pulling a silicon monocrystal from the silicon melt stored in a crucible, b) recharging the granular silicon material into the silicon melt stored in the crucible according to the method of claim 9; and c) subsequently to step (b) pulling another silicon monocrystal from the silicon melt stored in the crucible.

* * * * *